(12) United States Patent
Nitta

(10) Patent No.: US 7,127,219 B2
(45) Date of Patent: Oct. 24, 2006

(54) TRANSMITTER

(75) Inventor: Hitoshi Nitta, Yao (JP)

(73) Assignee: Sharp Kabushiki Kaisha, Osaka (JP)

( * ) Notice: Subject to any disclaimer, the term of this patent is extended or adjusted under 35 U.S.C. 154(b) by 659 days.

(21) Appl. No.: 09/908,627

(22) Filed: Jul. 20, 2001

(65) Prior Publication Data
US 2002/0025788 A1 Feb. 28, 2002

(30) Foreign Application Priority Data
Aug. 25, 2000 (JP) .............................. 2000-255261

(51) Int. Cl.
*H04B 1/04* (2006.01)
(52) U.S. Cl. ................. 455/126; 455/115.1; 455/127.1; 455/127.2; 455/127.3; 455/127.5
(58) Field of Classification Search ............. 455/115.1, 455/116, 127.1, 127.2, 127.3, 127.5
See application file for complete search history.

(56) References Cited

U.S. PATENT DOCUMENTS 5,170,495 A * 12/1992 McNicol et al. ............ 455/116
5,926,749 A * 7/1999 Igarashi et al. ........... 455/127.2
6,014,553 A * 1/2000 Kim ........................... 455/126
6,349,216 B1 * 2/2002 Alberth et al. ............ 455/550.1

FOREIGN PATENT DOCUMENTS

| JP | 59-132249 | 9/1984 |
| JP | 61-90330 | 6/1986 |
| JP | 8-316756 | 11/1996 |
| JP | 10-13256 | 1/1998 |

* cited by examiner

*Primary Examiner*—Quynh H. Nguyen
(74) *Attorney, Agent, or Firm*—Nixon & Vanderhye, PC

(57) ABSTRACT

An input signal having an intermediate signal superposed on a DC voltage is applied to a variable attenuation circuit through an amplifier. An output of the variable attenuation circuit is detected by a detecting circuit. A DC voltage from the detecting circuit is compared with a reference voltage from a reference voltage generating circuit by a comparing circuit. Based on a comparison output, the amount of attenuation of the variable attenuation circuit is controlled, and after the output of the variable attenuation circuit is amplified by an amplifier, it is mixed with a local oscillation signal from a local oscillation circuit at a mixer circuit, converted to a microwave signal, and transmitted.

7 Claims, 7 Drawing Sheets

TRANSMITTER

BACKGROUND OF THE INVENTION

1. Field of the Invention

The present invention relates to a transmitter. More specifically, the present invention relates to a transmitter for bi-directional microwave communication from general households or small-scale offices to broadcast satellites or communication satellites.

2. Description of the Background Art

The market for radio communication utilizing microwaves has been recently developed dramatically, along with developments of various systems including broadcast satellites and communication satellites. At the same time, the Internet has been developed and digital satellite broadcast has started, ever increasing the demand for bi-directional communication.

For bi-directional communication between a small-scale office or a general home and a broadcasting station, a broadcast satellite or a communication satellite is used. Currently, it is a dominant practice to use the satellite broadcast, as a signal transmission path for a down signal (downstream) from the broadcasting station to a general home, and to use a telephone line, as a signal transmission path for an up signal (upstream) from a general home to the broadcasting station.

The telephone line used for the upstream supports only a slow rate of communication, and therefore it is not suitable for exchanging motion picture, for example, hindering promotion of satellite multimedia applications. Thus, there has been an increasing necessity to introduce satellite communication not only to the downstream but also to the upstream transmission.

FIG. 6 shows a concept of bi-directional communication between each home and the broadcasting station through satellite broadcast.

Referring to FIG. 6, a parabola antenna 51 is provided on the roof, for example, of a broadcasting station 50, and parabola antennas 62 and 63 are provided on the roofs of homes 60 and 61, respectively. Through broadcasting satellite 70, microwave bi-directional communication is performed between each of the parabola antennas 62 and 63 of respective homes and parabola antenna 51 of broadcasting station 50. For bi-directional communication, microwave of 12 GHz band is used for one direction and microwave of 14 GHz band is used for the other direction. An LNB (Low Noise Block down Converter) similar to the one used in the conventional system for satellite broadcast reception is used as a receiver for bi-directional communication, and a transmitter is newly provided.

FIG. 7 is a block diagram of such a transmitter. Referring to FIG. 7, an indoor unit 20 converts a signal from a terminal such as a personal computer to a video signal, and outputs the same as an intermediate frequency signal of the band between 950 MHz to 1450 MHz to a coaxial cable 21. A DC voltage of 13V to 26V, for example, is supplied to coaxial cable 21, and the intermediate frequency signal is superposed on the DC voltage and supplied to a transmitter 30.

Transmitter 30 is positioned close to a parabola antenna provided on a roof, for example. The DC voltage supplied to coaxial cable 21 is converted to a prescribed voltage by a DC-DC converter, and supplied to various circuits.

The intermediate frequency signal is amplified by buffer circuits 31 and 32 to ensure a gain, and supplied to a mixer 33. To the mixer 33, a local oscillation signal is applied from a local oscillation circuit 34 through an amplifier 35, and by the mixer 33, the local oscillation signal and the intermediate frequency signal are mixed and converted to a microwave signal of 14 to 14.5 GHz. The microwave signal has its spurious component removed as it passes through a bandpass filter (BPF) 36, amplifiers 37, 38 and 39 formed of HEMTs (High Electron Mobility Transistors), a bandpass filter 40 and an amplifier 41.

Further, the microwave signal is amplified by a driver amplifier 42 to ensure a gain, has its components other than the high frequency signal removed by a highpass filter (HPF) 43, amplified by a high power amplifier 44 and supplied to an isolator 46 through a highpass filter 45. Thereafter, the microwave signal is transmitted to the broadcasting satellite from isolator 46 through the parabola antenna.

Once transmitter 30 shown in FIG. 7 is installed in a general household, bi-directional communication through the broadcasting satellite becomes possible. However, indoor unit 20 and transmitter 30 are expensive, and hence use thereof has not yet been widely spread among ordinary households. One reason why indoor unit 20 and transmitter 30 become expensive is that it is necessary to adjust power level of transmitter 30 with the level of the intermediate frequency signal output from indoor unit 20.

As transmitter 30 has only the function of converting the intermediate frequency signal to a microwave and amplifying the same, the level of the intermediate frequency signal input from indoor unit 20 to transmitter 30 varies dependent on the environment of installation, such as the length of the coaxial cable 21 between indoor unit 20 and transmitter 30. Therefore, there must be some means to adjust the output level of intermediate frequency signal output from indoor unit 20, which leads to higher cost.

SUMMARY OF THE INVENTION

Therefore, an object of the present invention is to provide a transmitter provided with a circuit for making constant an input intermediate frequency signal. Briefly stated, the present invention provides a transmitter outputting a microwave, including a circuit for making constant the level of an input intermediate frequency signal, and a frequency converting circuit frequency-converting the intermediate frequency signal of which level has been made constant by the circuit for making the level constant to a microwave signal.

Therefore, according to the present invention, even when there is a large level variation on the output side of the intermediate frequency signal or the cable loss of the intermediate frequency signal, a constant output power can be obtained. Thus, the necessity of power adjustment at the intermediate frequency signal output side that was required in the prior art is eliminated, and the cost can be reduced.

Preferably, the circuit for making constant the level of the input intermediate frequency signal includes a variable attenuation circuit receiving an intermediate frequency, with an amount of attenuation of the signal level being variable; a detecting circuit detecting an output signal of the variable attenuation circuit and outputting a detection signal in accordance with the input level; a reference voltage generating circuit generating a reference voltage; and a comparing circuit comparing the reference voltage from the reference voltage generating circuit and the detection signal from the detecting circuit, and changing the amount of attenuation of the variable attenuation circuit based on a comparison output signal. Thus, the variable attenuation circuit fixes the level of the intermediate frequency signal by a signal provided from a feedback loop including the detecting circuit, the reference voltage generating circuit and the comparing circuit.

More preferably, the transmitter includes a PIN diode of which amount of attenuation changes as terminal to terminal resistance thereof changes in accordance with the comparison output signal from the comparing circuit, and the detecting circuit includes a detecting diode rectifying an output signal of the variable attenuation circuit, a capacitor smoothing the rectified output signal to provide a DC signal, and a resistance providing a rectified DC signal, and the reference voltage generating circuit includes a plurality of resistance circuits.

More preferably, the transmitter further includes a buffer circuit provided on the input side and on the output side. Accordingly, variation of impedance at the input side can be suppressed, and influence of impedance variation on the side of the variable attenuation circuit to the output side can be prevented.

More preferably, the plurality of resistance circuits include a variable resistor, and the amount of attenuation of the variable attenuation circuit is adjusted by adjusting the variable resistor. This facilitates adjustment of the output level of the intermediate frequency signal from the variable attenuation circuit.

Further, the reference voltage generating circuit includes a temperature sensing element, and the variable attenuation circuit has its amount of attenuation adjusted in accordance with the change in the ambient temperature. Therefore, gain variation resulting from temperature change can be offset.

Further, the variable attenuation circuit includes a variable gain amplifier. The variable gain amplifier 10 by itself increases the overall gain, and therefore, an amplifier in the preceding stage can be eliminated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
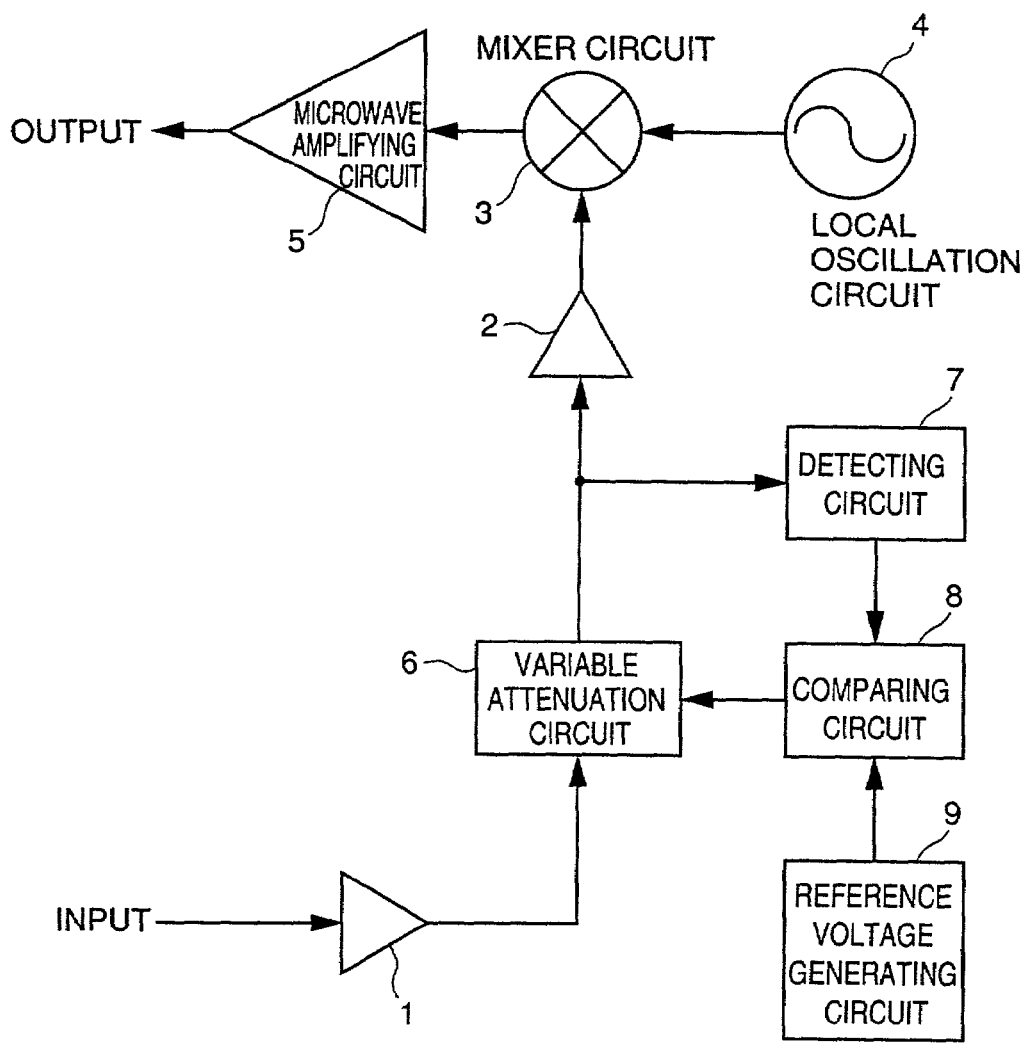
FIG. 1 shows a transmitter in accordance with one embodiment of the present invention.
Figure 7:
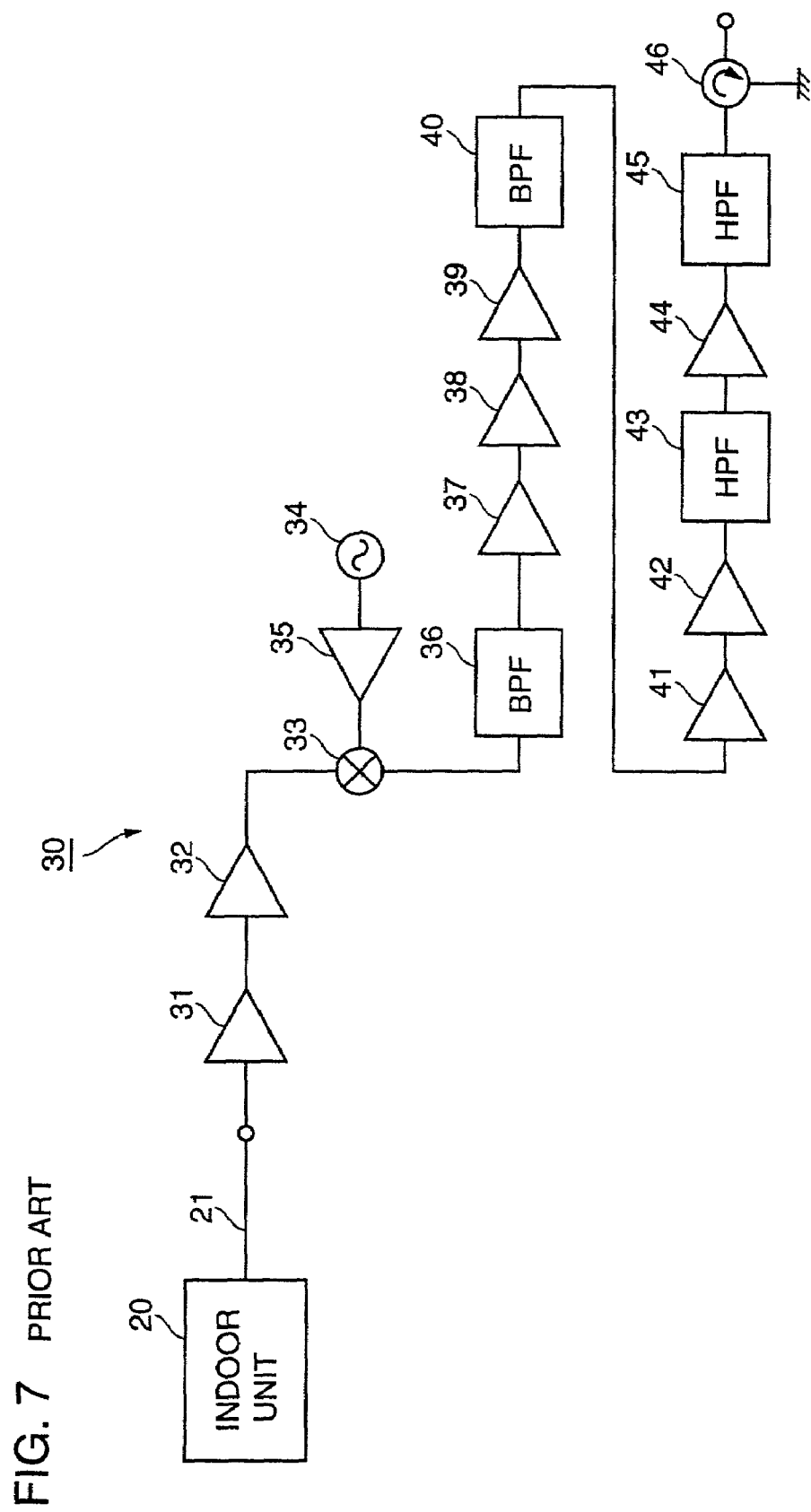
FIG. 7 is a block diagram of a conventional transmitter.

FIG. 1 is a block diagram of the transmitter in accordance with one embodiment of the present invention. Referring to FIG. 1, an input signal is applied from an indoor unit 20 shown in FIG. 7 through a coaxial cable 21, which has an intermediate frequency signal superposed on a DC voltage. The DC voltage is supplied to a power supply circuit, not shown, only the intermediate frequency signal is applied to and amplified by an amplifier 1 to ensure a prescribed gain, and thereafter it is applied to variable attenuation circuit 6. Variable attenuation circuit 6 changes the amount of level attenuation of the intermediate frequency signal, by a signal from a feedback loop including detecting circuit 7, comparing circuit 8 and reference voltage generating circuit 9.

The output of variable attenuation circuit 6 is applied to an amplifier 2 as well as to a detecting circuit 7. Detecting circuit 7 rectifies the intermediate frequency signal, converts to a DC voltage and applies the resulting voltage to comparing circuit 8. Comparing circuit 8 compares the reference voltage provided from reference voltage generating circuit 9 with the DC voltage applied from detecting circuit 7. When the DC voltage value from detecting circuit 7 is larger than the reference voltage from reference voltage generating circuit 9, control is such that signal attenuation by variable attenuation circuit 6 increases, and in the opposite case, control is such that the signal attenuation becomes smaller. Therefore, eventually, the control converges to a point at which the DC voltage value from detecting circuit 7 and the reference voltage value from reference voltage generating circuit 9 have the same value, and the level of the intermediate frequency signal is fixed.

Because of this structure of variable attenuation circuit 6, detecting circuit 7, comparing circuit 8 and reference voltage generating circuit 9, even when the level of the intermediate frequency signal input to variable attenuation circuit 6 varies, the level of the intermediate frequency signal output from the variable attenuation circuit 6 is fixed at the level corresponding to the reference voltage value of the reference voltage generating circuit 9.

The intermediate frequency signal of which level is made constant is input from variable attenuation circuit 6 to amplifier 2 where the gain is ensured, and thereafter the signal is input to mixer circuit 3. In mixer circuit 3, a local oscillation signal from local oscillation circuit 4 is mixed with the intermediate frequency signal, and the intermediate frequency signal is frequency-converted to a microwave signal. The microwave signal is input from mixer circuit 3 to microwave amplifying circuit 5 where desired gain and output power are ensured, and thereafter transmitted through the circuitry following BPF 36 shown in FIG. 7.

Figure 2:
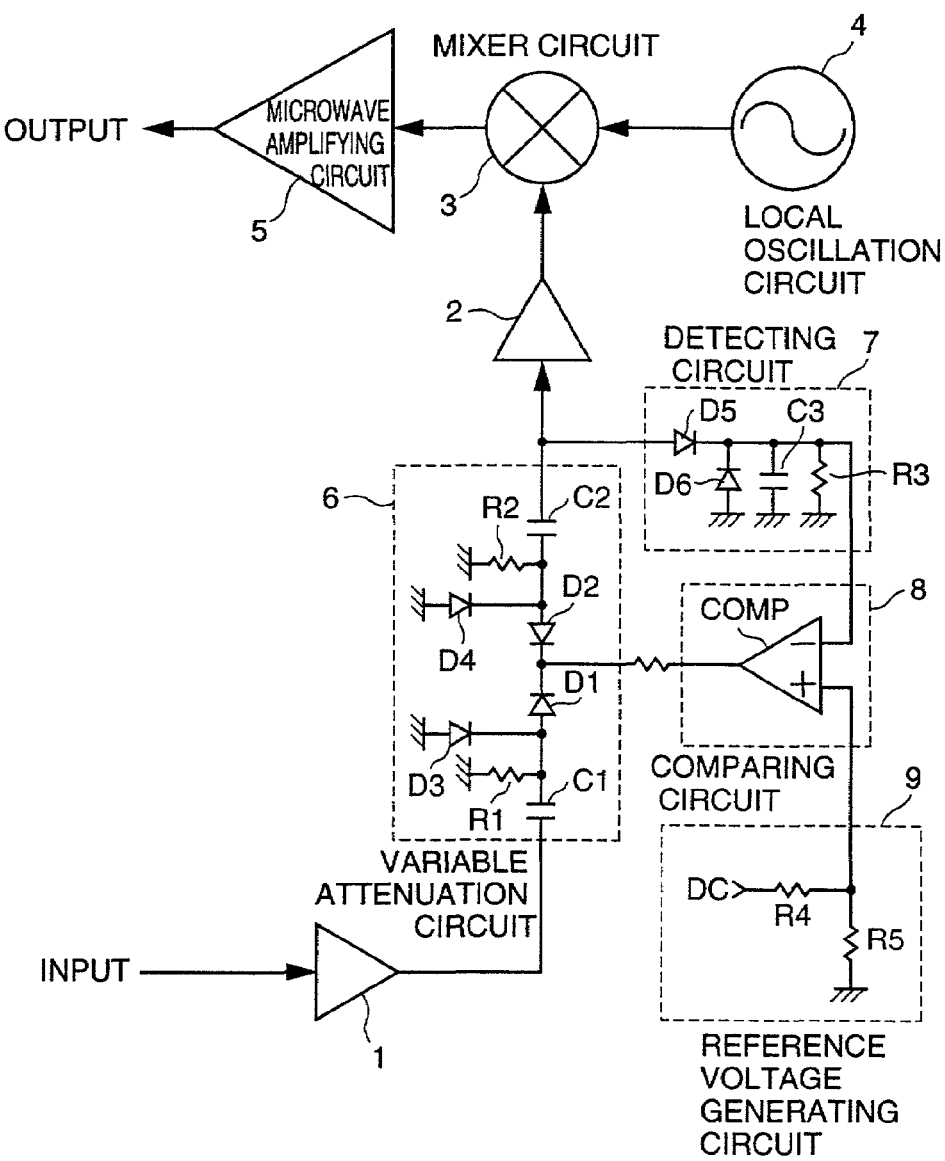
FIG. 2 is a more specific circuit diagram of the transmitter shown in FIG. 1.

FIG. 2 more specifically shows the variable attenuation circuit 6, detecting circuit 7, comparing circuit 8 and reference voltage generating circuit 9 shown in FIG. 1. Referring to FIG. 2, variable attenuation circuit 6 has a configuration of a π type attenuator, including a series circuit of a capacitor C1, PIN diodes D1 and D2 and a capacitor C2, a parallel circuit including a PIN diode D3 and a resistance R1 connected between a node of PIN diode D1 and capacitor C1 and the ground, and a parallel circuit including a PIN diode D4 and a resistance R2 connected between a node of capacitor C2 and PIN diode D2 and the ground.

Detecting circuit 7 includes rectifying diodes D5 and D6, a smoothing capacitor C3 and a resistance R3. Comparing circuit 8 includes a comparator COMP, and the reference voltage generating circuit 9 includes resistances R4 and R5 voltage-dividing the DC voltage DC and providing the reference voltage. Comparator 7 compares the DC voltage applied from detecting circuit 7 with the reference voltage applied from reference voltage generating circuit 9, controls the terminal-to-terminal resistance between PIN diodes D1 and D2 of variable attenuation circuit 6, so as to control the overall amount of attenuation of the variable attenuation circuit 6. More specifically, when the DC voltage value from detecting circuit 7 is smaller than the DC voltage value from reference voltage generating circuit 9, comparator COMP supplies a DC current to variable attenuation circuit 6.

At this time, the amount of signal attenuation in variable attenuation circuit 6 decreases, and therefore, the input level of the intermediate frequency signal to the detecting circuit 7 increases, so that the DC voltage value input from detecting circuit 7 to comparing circuit 8 increases. When this value becomes larger than the DC voltage value from reference voltage generating circuit 9, the amount of attenuation of variable attenuation circuit 6 increases, the input level of the intermediate frequency signal to detecting circuit 7 decreases, and the DC voltage input to comparing circuit 8 decreases.

By the repetition of the above described operations, the DC voltage value input from detecting circuit 7 to comparing circuit 8 converges to a value that is equal to the DC voltage value from reference voltage generating circuit 9. In this manner, even when the level of the intermediate frequency signal input to variable attenuation circuit 6 varies, the level of the intermediate frequency signal output from variable attenuation circuit 6 is kept at a constant value.

In the embodiment shown in FIG. 2, a variable attenuation circuit 6 is connected between amplifiers 1 and 2. When the input level varies, input return loss varies in the amplifier 1 on the input side, and therefore, it serves to suppress the variation of the input impedance at that time. The amplifier 2 on the output side prevents influence of the variation of the impedance on the side of variable attenuation circuit 6 to the conversion gain of mixer circuit 3, and it also prevents leakage of the local oscillation signal from local oscillation circuit 4 to the side of detecting circuit 7 to be superposed on the DC voltage as the output of detecting circuit 7.

Though the variable attenuation circuit 6 shown in FIG. 2 has the configuration of a $\pi$ attenuator, an attenuator of a different type may be used in accordance with the desired characteristics. Further, the number of PIN diodes used may be changed in accordance with the characteristics such as deviation within the band.

Figure 3:
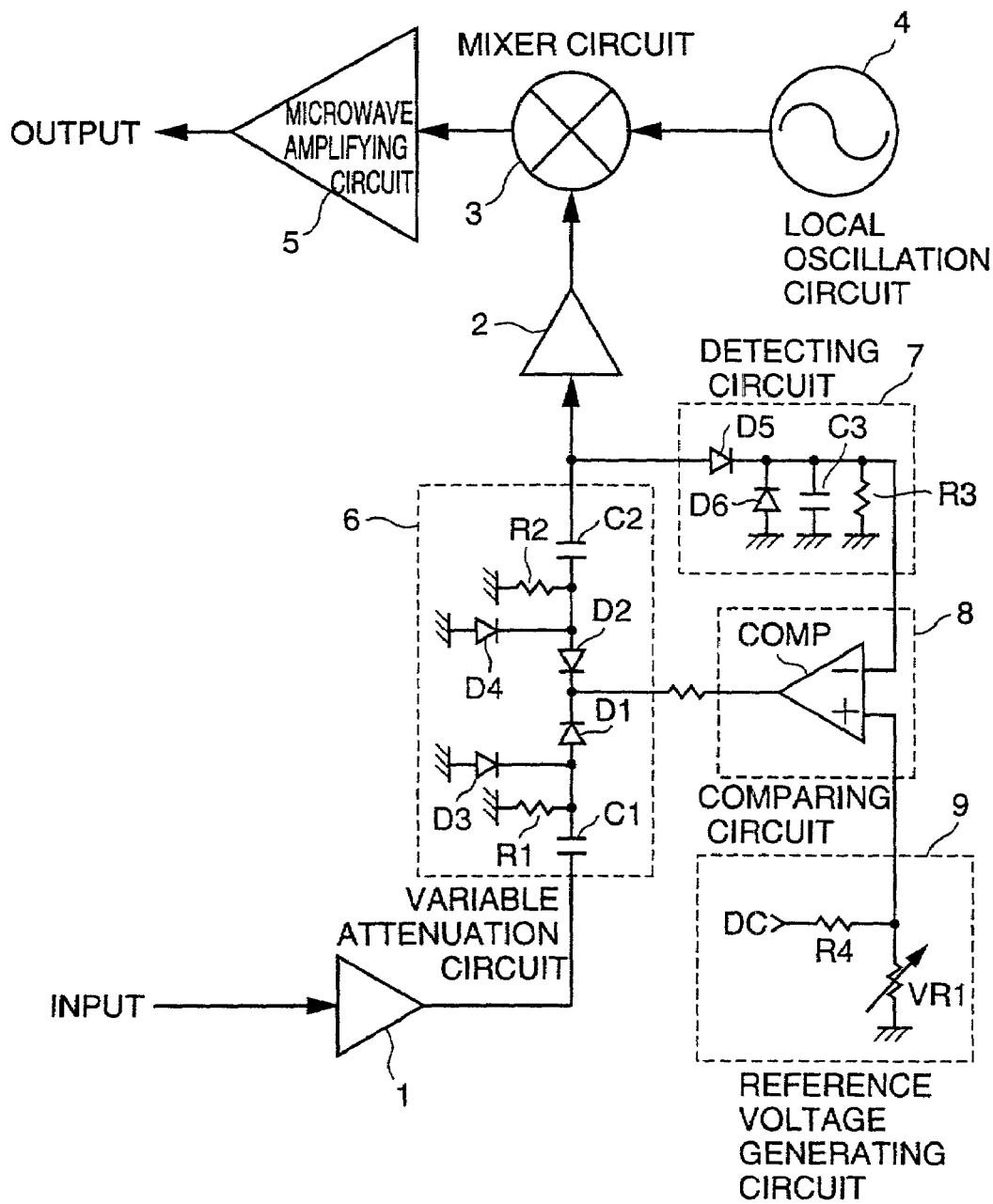
FIG. 3 shows a transmitter in accordance with another embodiment of the present invention.

FIG. 3 shows a transmitter in accordance with another embodiment of the present invention. In the embodiment shown in FIG. 3, the resistance R5 of the reference voltage generating circuit shown in FIG. 2 is replaced by a variable resistor VR1. By providing a variable resistor VR1, the value of the reference voltage generated from reference voltage generating circuit 9 can be changed in a simple manner. As the reference voltage value determines the output level of the intermediate frequency signal from variable attenuation circuit 6, it becomes possible to adjust the output level of the intermediate frequency signal from variable attenuation circuit 6. Accordingly, even when amplifier 2 and microwave amplifying circuit 5 have variable gains, the output power can be adjusted to a value desired for a transmitter, by adjusting the variable resistor VR1 product by product.

Figure 4:
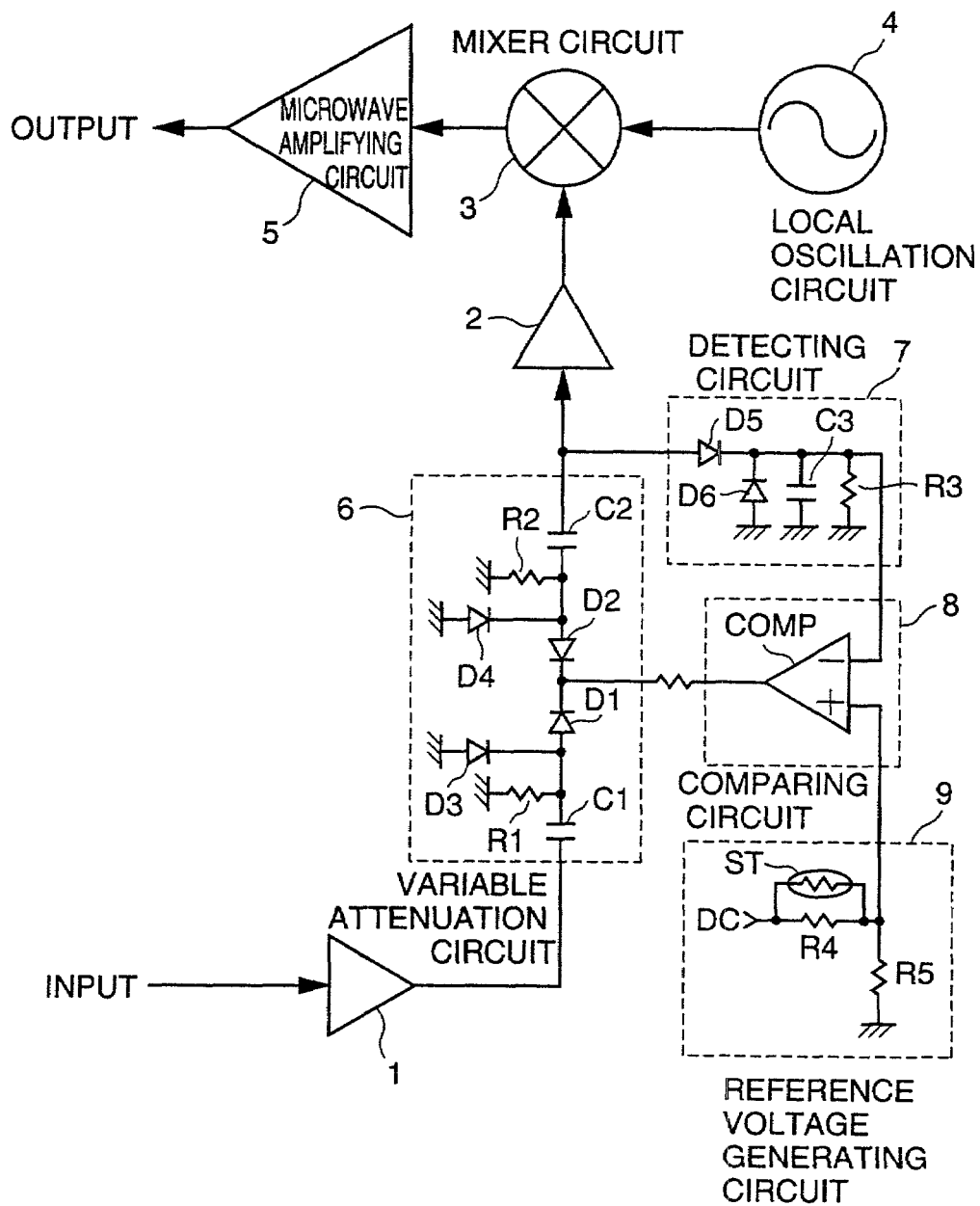
FIG. 4 shows a transmitter in accordance with a further embodiment of the present invention.

FIG. 4 shows a transmitter in accordance with a still further embodiment of the present invention. In the transmitter shown in FIG. 4, a thermister ST is connected parallel to the resistance R4 of reference voltage generating circuit 9 shown in FIG. 2. As the thermister ST is provided, the generated reference voltage value comes to be changed in accordance with the change in the temperature. The gain of amplifier 2, mixer 3 or microwave amplifying circuit 5 always has a temperature characteristic, and tends to increase at a low temperature and decrease at a high temperature. By such a configuration that decreases the reference voltage value output from reference voltage generating circuit 9 at a low temperature and increases the reference voltage value at a high temperature, temperature characteristic of the gain can be offset, and the temperature characteristic of the output power of the transmitter can be improved significantly. Generally, temperature characteristic of the thermister ST is non-linear. Therefore, it is possible to adjust the resistance R4 connected in parallel, to use two thermisters ST, or to use a negative characteristic NTC type thermister ST or a positive characteristic PTC type thermister.

Figure 5:
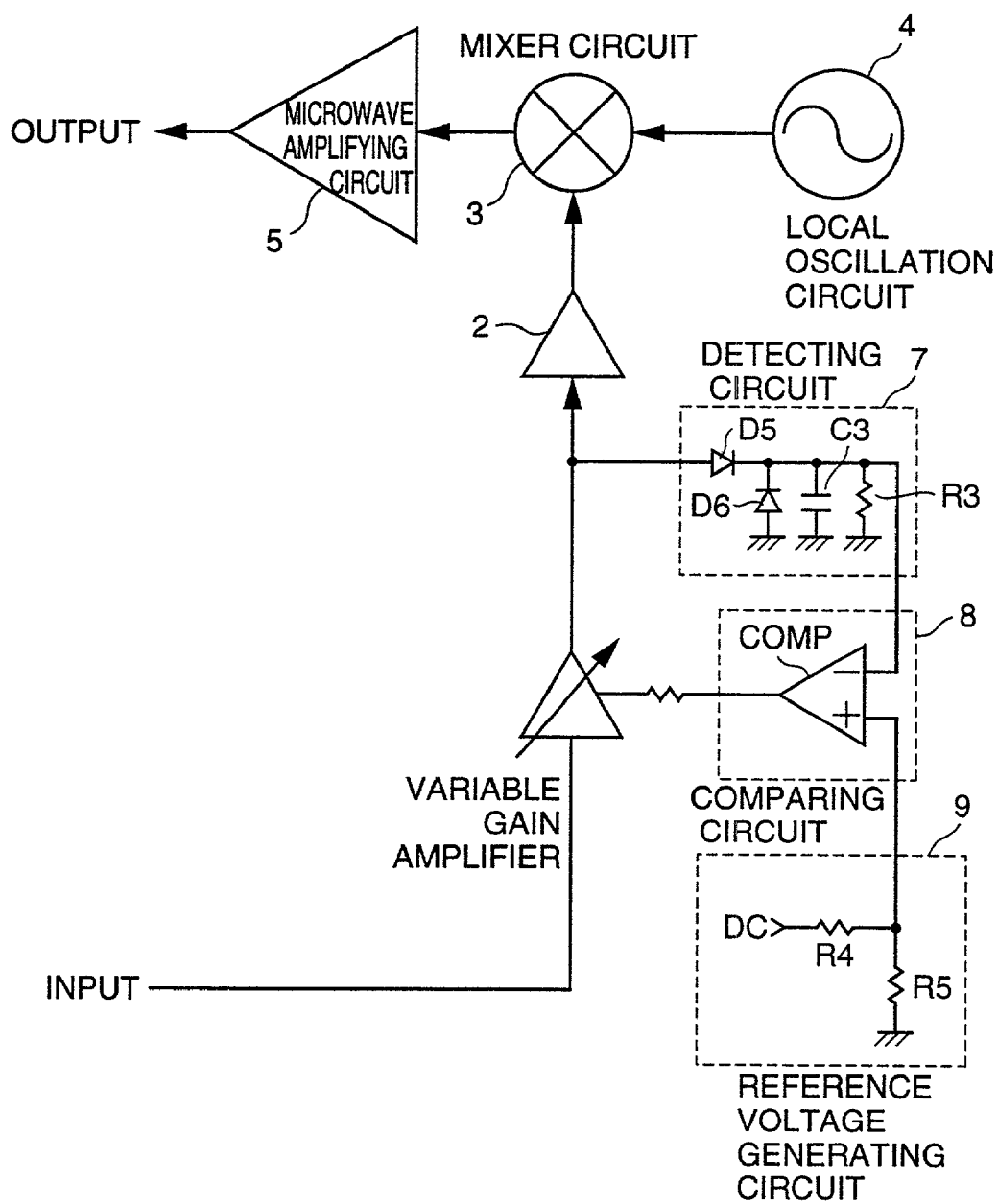
FIG. 5 shows a transmitter in accordance with a still further embodiment of the present invention.
Figure 6:
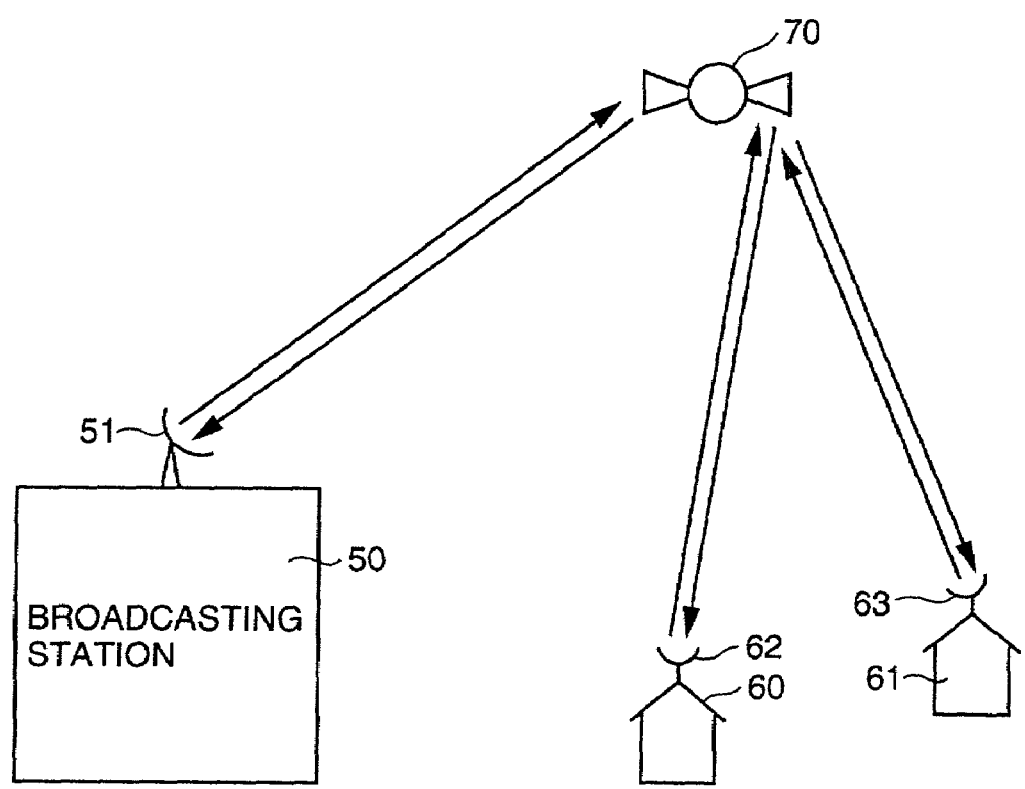
FIG. 6 is an illustration showing the concept of bi-directional communication between homes and a broadcasting station through satellite broadcast.

FIG. 5 shows a transmitter in accordance with a still further embodiment of the present invention. In the embodiment shown in FIG. 5, a variable gain amplifier 10 is provided in place of amplifier 1 and variable attenuation circuit 6 shown in FIG. 1. Variable gain amplifier 10 has gain which is variable based on an output of comparing circuit 8, and attains the same effect as variable attenuation circuit 6 of FIG. 1. Further, as the overall gain can be increased by variable gain amplifier 10 by itself, amplifier 1 of the preceding stage can be eliminated, and hence the area of occupation can be reduced and the cost can be reduced as the number of necessary parts decreases. Further, as it becomes unnecessary to cause a current flow to PIN diodes D1 and D2 based on the output of comparing circuit 8, power consumption can also be reduced.

As described above, according to the embodiments of the present invention, as a circuit that makes constant the input level is added to the transmitter, even when there is a significant variation in the output level of the indoor unit or there is a cable loss of the intermediate frequency signal, a constant output power can be obtained from the transmitter. Therefore, power adjustment at the indoor unit that was necessary in the prior art can be eliminated. This means that simple installation of the indoor unit and the transmitter is sufficient for use, and hence the necessary cost can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A transmitter outputting a microwave signal, comprising:
   a circuit for making constant a level of an input intermediate frequency signal; and
   a frequency converting circuit frequency-converting the intermediate frequency signal of which level is made constant by said circuit for making constant the level, to said microwave signal,
   wherein the detection is made at a point between the circuit and the frequency converting circuit,
   wherein said circuit for making constant the level of the input intermediate frequency signal includes
      a $\pi$-type variable attenuation circuit receiving said intermediate frequency signal, of which amount of level attenuation is variable,
      a detecting circuit detecting an output signal of said variable attenuation circuit and providing a detection signal in accordance with an input level,
      a reference voltage generating circuit generating a reference voltage, and
      a comparing circuit comparing the reference voltage from said reference voltage generating circuit with the detection signal from said detecting circuit, and varying the amount of attenuation of said variable attenuation circuit based on a comparison output signal, wherein said variable attenuation circuit includes a PIN diode having each amount of attenuation changed as terminal to terminal resistance changes in accordance with the comparison output signal from said comparing circuit, wherein said detecting circuit includes a detecting diode rectifying an output signal of said variable attenuation circuit, a capacitor smoothing the rectified output signal to provide a DC signal, and a resistance outputting the rectified DC signal, and wherein said reference voltage generating circuit includes a plurality of resistance circuits.

2. The transmitter according to claim 1, further comprising a buffer circuit provided on each of input and output sides of said variable attenuation circuit.

3. The transmitter according to claim 1, wherein said plurality of resistance circuits include a variable resistor, and the amount of attenuation of said variable attenuation circuit is adjusted by adjusting said variable resistor.

4. The transmitter according to claim 1, wherein said reference voltage generating circuit includes a temperature detecting element, and the amount of attenuation of said variable attenuation circuit is adjusted in accordance with a change of ambient temperature.

5. A microwave transmitter, comprising:

a circuit for making constant a level of an input intermediate frequency signal based on a detection of an intermediate frequency output of the circuit;

a frequency converting circuit frequency-converting the constant-level intermediate frequency signal output by the circuit to a microwave signal, wherein the detection is made at a point between the circuit and the frequency converting circuit, wherein said circuit for making constant the level of the input intermediate frequency signal includes:

a π-type variable attenuation circuit receiving said intermediate frequency signal, of which amount of level attenuation is variable, a detecting circuit detecting an output signal of said variable attenuation circuit and providing a detection signal in accordance with an input level, a reference voltage generating circuit generating a reference voltage, and a comparing circuit comparing the reference voltage from said reference voltage generating circuit with the detection signal from said detecting circuit, and varying the amount of attenuation of said variable attenuation circuit based on a comparison output signal, wherein said variable attenuation circuit includes a PIN diode having each amount of attenuation changed as terminal to terminal resistance changes in accordance with the comparison output signal from said comparing circuit, wherein said detecting circuit includes a detecting diode rectifying an output signal of said variable attenuation circuit, a capacitor smoothing the rectified output signal to provide a DC signal, and a resistance outputting the rectified DC signal, and wherein said reference voltage generating circuit includes a plurality of resistance circuits.

6. The transmitter according to claim 5, wherein the reference voltage generating circuit comprises a thermistor.

7. The transmitter according to claim 5, wherein the reference voltage generating circuit comprises a variable resistor.

* * * * *